United States Patent
Kakegawa

(10) Patent No.: US 6,757,880 B2
(45) Date of Patent: Jun. 29, 2004

(54) LOGICAL CIRCUIT DESIGNING DEVICE, LOGICAL CIRCUIT DESIGNING METHOD, STORAGE MEDIUM AND PROGRAM

(75) Inventor: Makoto Kakegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 09/960,501

(22) Filed: Sep. 24, 2001

(65) Prior Publication Data

US 2002/0199163 A1 Dec. 26, 2002

(30) Foreign Application Priority Data

Jun. 13, 2001 (JP) ......................................... 2001-178176

(51) Int. Cl.[7] .............................................. G06F 17/50
(52) U.S. Cl. .................................. 716/11; 716/8; 716/9
(58) Field of Search ........................................ 716/1–14

(56) References Cited

U.S. PATENT DOCUMENTS

| | | | | |
|---|---|---|---|---|
| 5,046,017 A | * | 9/1991 | Yuyama et al. ............... 716/13 |
| 5,375,069 A | * | 12/1994 | Satoh et al. .................. 716/14 |
| 5,926,397 A | * | 7/1999 | Yamanouchi ................ 716/14 |
| 6,042,613 A | * | 3/2000 | Tsukamoto ................... 716/18 |
| 6,086,625 A | * | 7/2000 | Shouen ........................... 716/1 |
| 6,145,116 A | * | 11/2000 | Tawada .......................... 716/6 |
| 6,385,761 B1 | * | 5/2002 | Breid ............................. 716/8 |

FOREIGN PATENT DOCUMENTS

JP     A-09-274623     10/1997

* cited by examiner

Primary Examiner—Matthew Smith
Assistant Examiner—Sun James Lin
(74) Attorney, Agent, or Firm—Staas & Halsey LLP

(57) ABSTRACT

By comprising a logical circuit storage unit for storing a logical circuit, a transmission line circuit generation unit for generating a transmission line circuit based on the logical circuit stored in the logical circuit storage unit, a transmission line circuit storage unit for storing the transmission line circuit generated by the transmission line circuit generation unit, a transmission line circuit editing unit for editing the transmission line circuit stored in the transmission line storage unit and a logical circuit modification unit for modifying the generated logical circuit based on the transmission line circuit edited by the transmission line circuit editing unit, work that has been manually done can be automated. Therefore, labor can be reduced and data reliability can be improved.

53 Claims, 31 Drawing Sheets

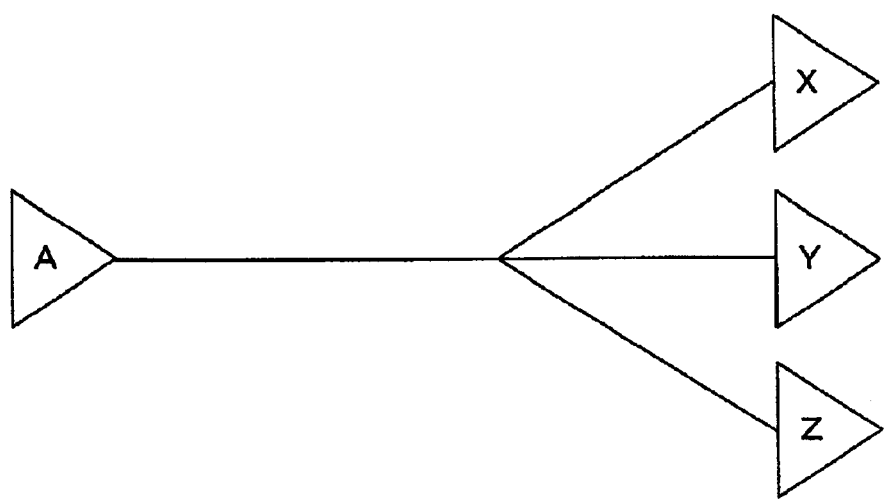
F I G. 5

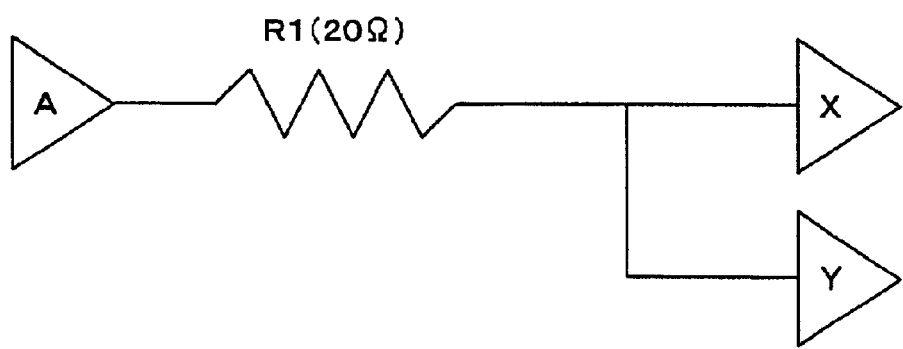
F I G. 7

| ITEM NO. | SYMBOL | COMPONENT DESCRIPTION | VALUE |
|---|---|---|---|
| 1 | R1 | RESISTOR | 33 Ω |

FIG. 8

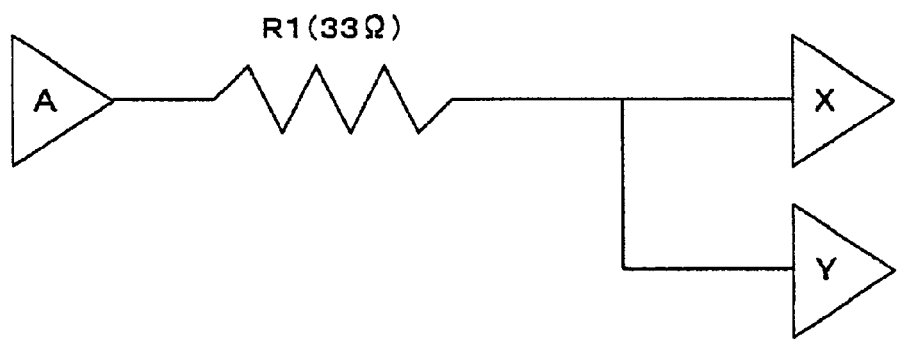
F I G. 9

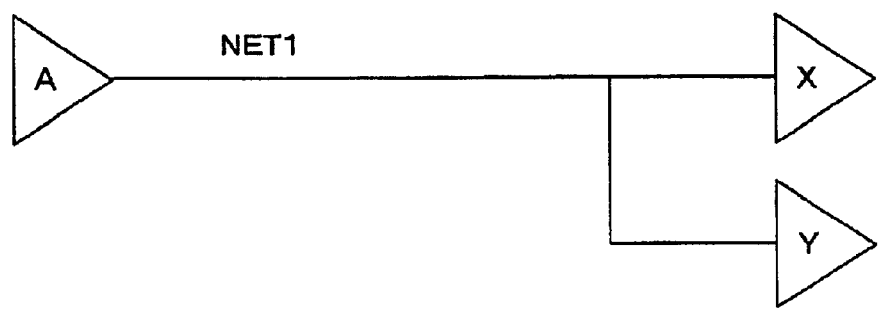
F I G. 1 0

| ITEM NO. | NET | LOCATION | COMPONENT DESCRIPTION | VALUE |
|---|---|---|---|---|
| 1 | NET1 | BY THE SIDE OF A | RESISTOR | 33 Ω |

FIG. 11

| ITEM NO. | SYMBOL |
|---|---|
| 1 | R1 |

FIG. 14

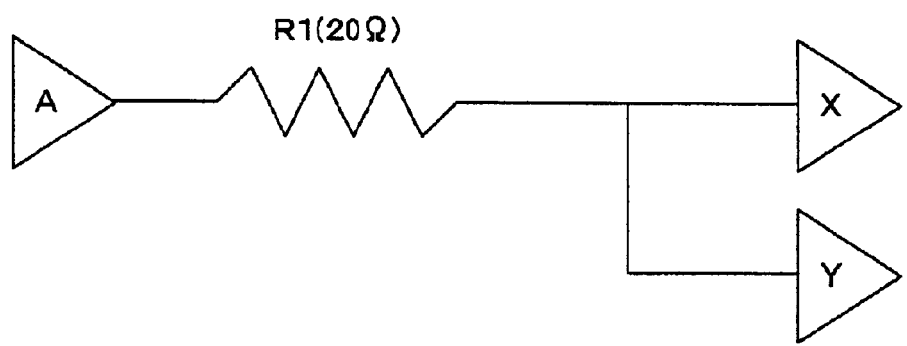
F I G. 1 6

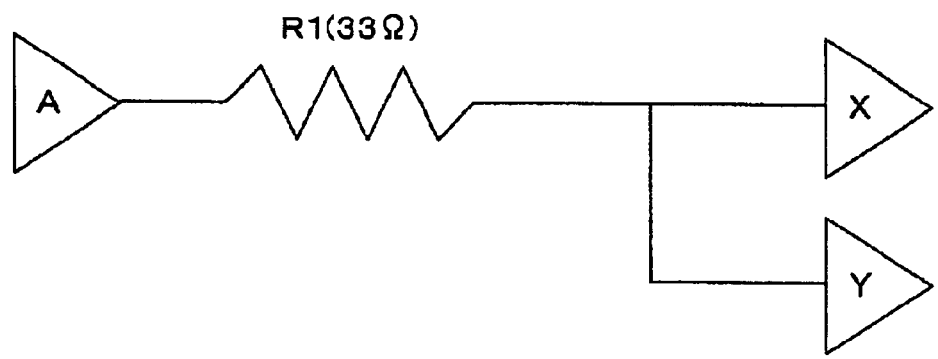
F I G. 2 1

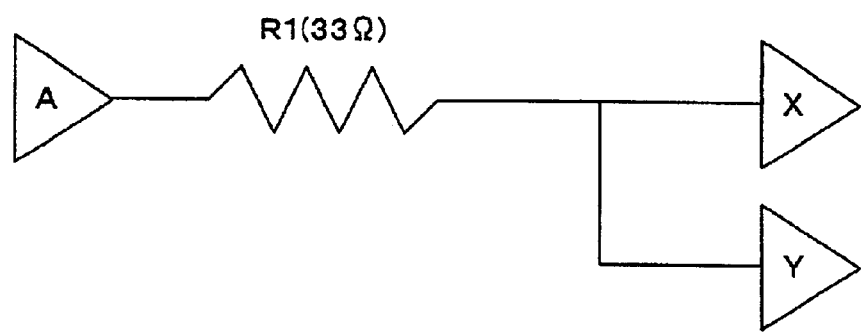
F I G. 2 2

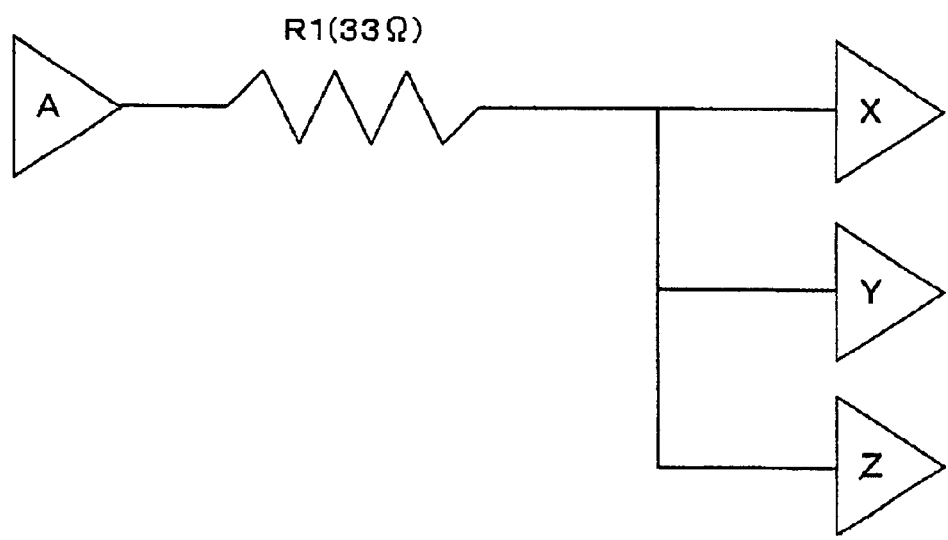
F I G. 2 5

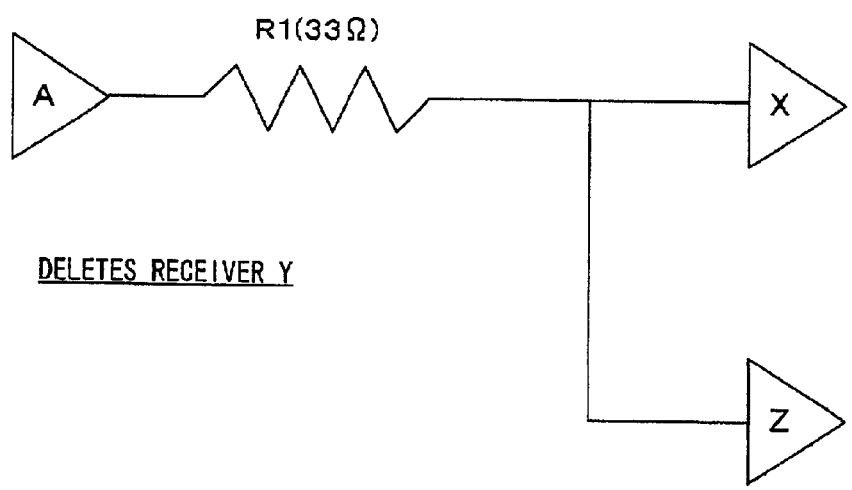
F I G. 26

LOGICAL CIRCUIT DESIGNING DEVICE, LOGICAL CIRCUIT DESIGNING METHOD, STORAGE MEDIUM AND PROGRAM

BACKGROUND OF THE INVENTION

1. Field of the Invention

The present invention relates to a linkage technology between a logical circuit designing tool and a transmission line circuit analysis tool and, in particular a logical circuit designing device, a logical circuit designing method, a storage medium and a program for feeding back a logical circuit modified using a transmission line circuit analysis tool to a logical design tool.

2. Description of the Related Art

Lately, a variety of digital technologies, such as the design technology and production technology of LSIs, have remarkably advanced. For example, very high-performance CPUs have been integrated in one chip. The storage capacity of a semi-conductor memory has also remarkably increased. Thus, digital technologies have rapidly advanced in a variety of aspects.

For example, a variety of software technologies, such as the software technology of man-machine interface, have also advanced.

Thanks to the progress of such digital and software technologies, for example, a CAD apparatus using a computer, such as EWS (engineering workstation), has been used in a design field, such as an electrical circuit designing and the like.

In a conventional logical circuit design, a logical circuit is first generated using a tool for making logical circuits, a transmission line circuit is further generated by manual input work based on the logical circuit in order to verify this logical circuit.

Although the transmission line circuit used to verify the logical circuit is modified to reflect the verification result, this modification result must also be reflected on the logical circuit by manual input work.

However, when a transmission line circuit is generated from a logical circuit generated using a tool for making logical circuits, in most cases, only both output and input can be distinguished and the transmission line circuit must be edited by an editor. For that reason, the generation of the transmission line circuit requires much labor and the reliability is reduced.

SUMMARY OF THE INVENTION

The present invention is made in view of the problem, and it is an object of the present invention to provide a logical circuit designing device, a logical circuit designing method, a storage medium and a program for automating work manually done and implementing both the reduction of labor and the improvement of data reliability.

The logical circuit designing device of the present invention comprises a logical circuit storage unit, a transmission line circuit generation unit, a transmission line circuit storage unit, a transmission line circuit editing unit and a logical circuit modification unit.

In the first aspect of the present invention, the logical circuit storage unit stores a logical circuit. The transmission line circuit generation unit generates a transmission line circuit based on the logical circuit stored in the logical circuit storage unit. The transmission line circuit storage unit stores the transmission line circuit generated by the transmission line circuit generation unit.

In the second aspect of the present invention, the logical circuit storage unit stores a logical circuit. The transmission line circuit storage unit stores a transmission line circuit corresponding to the logical circuit stored in the logical circuit storage unit. The transmission line circuit editing unit edits the transmission line circuit stored in the transmission line circuit storage unit. The logical circuit modification unit modifies the corresponding logical circuit based on the transmission line circuit edited by the transmission line circuit editing unit.

In the third aspect of the present invention, the logical circuit storage unit stores a logical circuit. The transmission line circuit generation unit generates a transmission line circuit based on the logical circuit stored in the logical circuit storage unit. The transmission line circuit storage unit stores the transmission line circuit generated by the transmission line circuit generation unit. The transmission line circuit editing unit edits the transmission line circuit stored in the transmission line circuit storage unit. The logical circuit modification unit modifies the corresponding logical circuit based on the transmission line circuit edited by the transmission line circuit editing unit.

BRIEF DESCRIPTION OF THE DRAWINGS

FIG. 5 shows an example of topology designation (star type);

FIG. 7 shows an example of the value designation of a resistor, a capacitor or a coil (logical circuit);

FIG. 8 shows an example of the value designation of a resistor, a capacitor or a coil (value designation table);

FIG. 9 shows an example of the value designation of a resistor, a capacitor or a coil (transmission line circuit);

FIG. 10 shows an example of the addition designation of a resistor, a capacitor or a coil (logical circuit);

FIG. 11 shows an example of the addition designation of a resistor, a capacitor or a coil (addition designation table);

FIG. 14 shows an example of the deletion designation of a resistor, a capacitor or a coil (addition designation table);

FIG. 16 shows an example of the value modification of a resistor, a capacitor or a coil (logical circuit: original);

FIG. 21 shows an example of the component modification of a resistor, a capacitor or a coil (logical circuit: after modification);

FIG. 22 shows an example of component addition (logical circuit: original);

FIG. 25 shows an example of component deletion (logical circuit: original);

FIG. 26 shows an example of component deletion (transmission line circuit);

DESCRIPTION OF THE PREFERRED EMBODIMENTS

Figure 1:
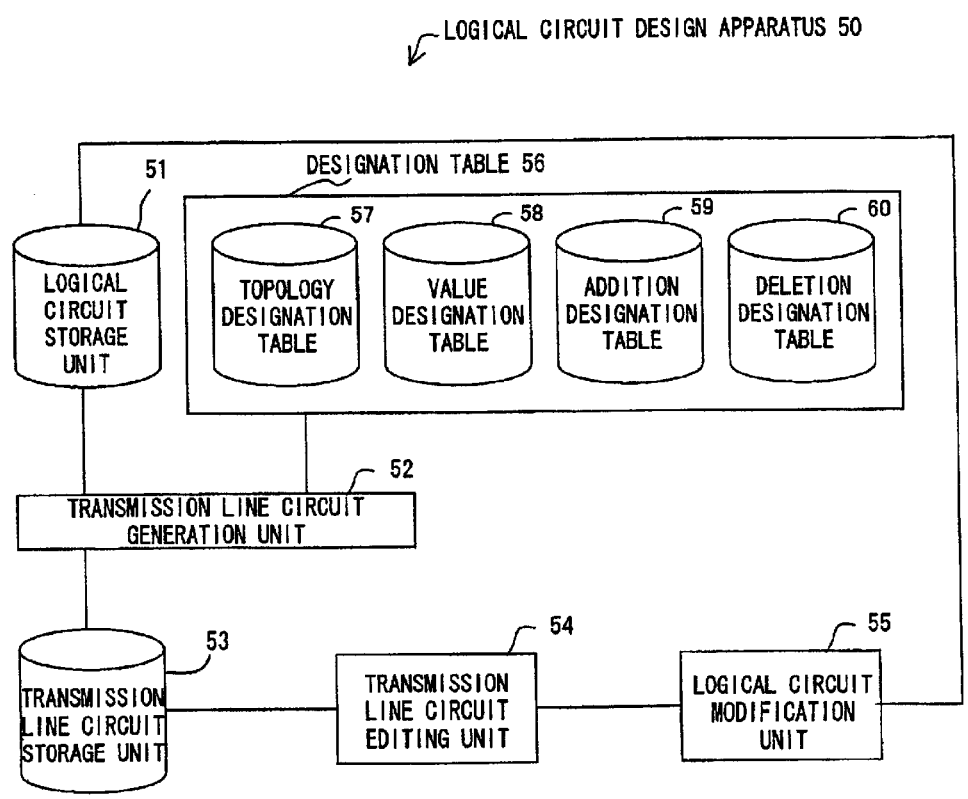
FIG. 1 shows the overall configuration of a logical circuit designing device adopting the present invention.

The preferred embodiments of the present invention are described below with reference to the drawings.

To solve the problem, the present invention adopts the following configurations.

According to one aspect of the present invention, the logical circuit designing device comprises a logical circuit storage unit for storing a logical circuit, a transmission line circuit generation unit for generating a transmission line circuit based on the logical circuit stored in the logical circuit storage unit and a transmission line circuit storage unit for storing the transmission line circuit generated by the transmission line circuit generation unit.

According to another aspect of the present invention, the logical circuit designing device comprises a logical circuit storage unit for storing a logical circuit, a transmission line circuit storage unit for storing a transmission line circuit corresponding to the logical circuit stored in the logical circuit storage unit, a transmission line circuit editing unit for editing the transmission line circuit stored in the transmission line circuit storage unit and a logical circuit modification unit for modifying the corresponding logical circuit based on the transmission line circuit edited by the transmission line circuit editing unit.

According to another aspect of the present invention, the logical circuit designing device comprises a logical circuit storage unit for storing a logical circuit, a transmission line circuit generation unit for generating a transmission line circuit based on the logical circuit stored in the logical circuit storage unit, a transmission line circuit storage unit for storing the transmission line circuit generated by the transmission line circuit generation unit, a transmission line circuit editing unit for editing the transmission line circuit stored in the transmission line circuit storage unit and a logical circuit modification unit for modifying the corresponding logical circuit based on the transmission line circuit edited by the transmission line circuit editing unit.

The logical circuit designing device of the present invention further comprises a topology designation table for storing topology information indicating the type of the connection between active components composing a logical circuit and it is preferable for the transmission line circuit generation unit to generate a transmission line circuit based on the topology information stored in the topology designation table.

The logical circuit designing device of the present invention further comprises a value designation table for storing the value of a passive component composing a logical circuit, and it is preferable for the transmission line circuit generation unit to generate a transmission line circuit based on the value stored in the value designation table.

The logical circuit designing device of the present invention further comprises an addition designation table for storing the addition information of a passive component composing a logical circuit, and it is preferable for the transmission line circuit generation unit to generate a transmission line circuit by adding the passive component based on the passive component addition information stored in the addition designation table.

The logical circuit designing device of the present invention further comprises a deletion designation table for storing the addition information of a passive component composing a logical circuit, and it is preferable for the transmission line circuit generation unit to generate a transmission line circuit by deleting the passive component based on the passive component deletion information stored in the deletion designation table.

In the logical circuit designing device of the present invention, it is also preferable for the logical circuit modification unit to modify the logical circuit stored in the logical circuit storage unit based on the transmission line circuit edited by the transmission line circuit editing unit.

In the logical circuit designing device of the present invention, it is also preferable for the logical circuit modification unit to modify the value of the passive components of the logical circuit stored in the logical circuit storage unit based on the transmission line circuit edited by the transmission line circuit editing unit.

In the logical circuit designing device of the present invention, it is also preferable for the logical circuit modification unit to modify the passive component addition information of the logical circuit stored in the logical circuit storage unit based on the transmission line circuit edited by the transmission line circuit editing unit.

In the logical circuit designing device of the present invention, it is also preferable for the logical circuit modification unit to modify the passive component deletion information of the logical circuit stored in the logical circuit storage unit based on the transmission line circuit edited by the transmission line circuit editing unit.

In the logical circuit designing device of the present invention, it is also preferable for the logical circuit modification unit to modify the logical circuit based on the difference between the transmission line circuit edited by the transmission line circuit editing unit and the logical circuit stored in the logical circuit storage unit.

FIG. 1 shows the overall configuration of a logical circuit designing device adopting the present invention.

The logical circuit designing device 50 shown in FIG. 1 comprises a logical circuit storage unit 51, a transmission line circuit generation unit 52, s transmission line circuit storage unit 53, a transmission line circuit editing unit 54, a logical circuit modification unit 55 and a designation table 56.

The logical circuit storage unit 51 stores a logical circuit.

The transmission line circuit generation unit 52 generates a transmission line circuit based on the logical circuit stored in the logical circuit storage unit 51.

The transmission line circuit storage unit 53 stores the transmission line circuit generated by the transmission line circuit generation unit 52 or the transmission line circuit corresponding to the logical circuit stored in the logical circuit storage unit 51.

The transmission line circuit editing unit 54 edits the transmission line circuit stored in the transmission line circuit storage unit 53.

The logical circuit modification unit 55 modifies the corresponding logical circuit or the generated logical circuit, based on the transmission line circuit edited by the transmission line circuit editing unit 54.

The designation table 56 further comprises a topology designation table 57, a value designation table 58, an addition designation table 59 and a deletion designation table 60.

The topology designation table 57 stores topology information indicating the type of the connection between active components composing a logical circuit. Then, the transmission line circuit generation unit 52 generates a transmission line circuit based on the topology information stored in the topology designation table 57.

The value designation table 58 stores the value of a passive component composing a circuit. Then, the transmission line circuit generation unit 52 generates a transmission line circuit based on the value stored in the value designation table 58.

The addition designation table 59 stores the addition information of a passive component composing a logical circuit. Then, the transmission line circuit generation unit 52 generates a transmission line circuit by adding the passive component based on the passive component addition information stored in the addition designation table 59.

The deletion table 60 stores the deletion information of a passive component composing a logical circuit. Then, the transmission line circuit generation unit 52 generates a transmission line circuit by deleting the passive component based on the passive component deletion information stored in the deletion designation table 60.

The logical circuit modification unit 55 modifies the logical circuit stored in the logical circuit storage unit 51 based on the transmission line circuit edited by the transmission line circuit editing unit 54.

The logical circuit modification unit 55 also modifies the value of the passive component, passive component addition information or passive component deletion information of the logical circuit stored in the logical circuit storage unit 51.

The logical circuit modification unit 55 also modifies the logical circuit based on the difference between the transmission line circuit edited by the transmission line circuit editing unit 54 and the logical circuit stored in the logical circuit storage unit 51.

Figure 2:
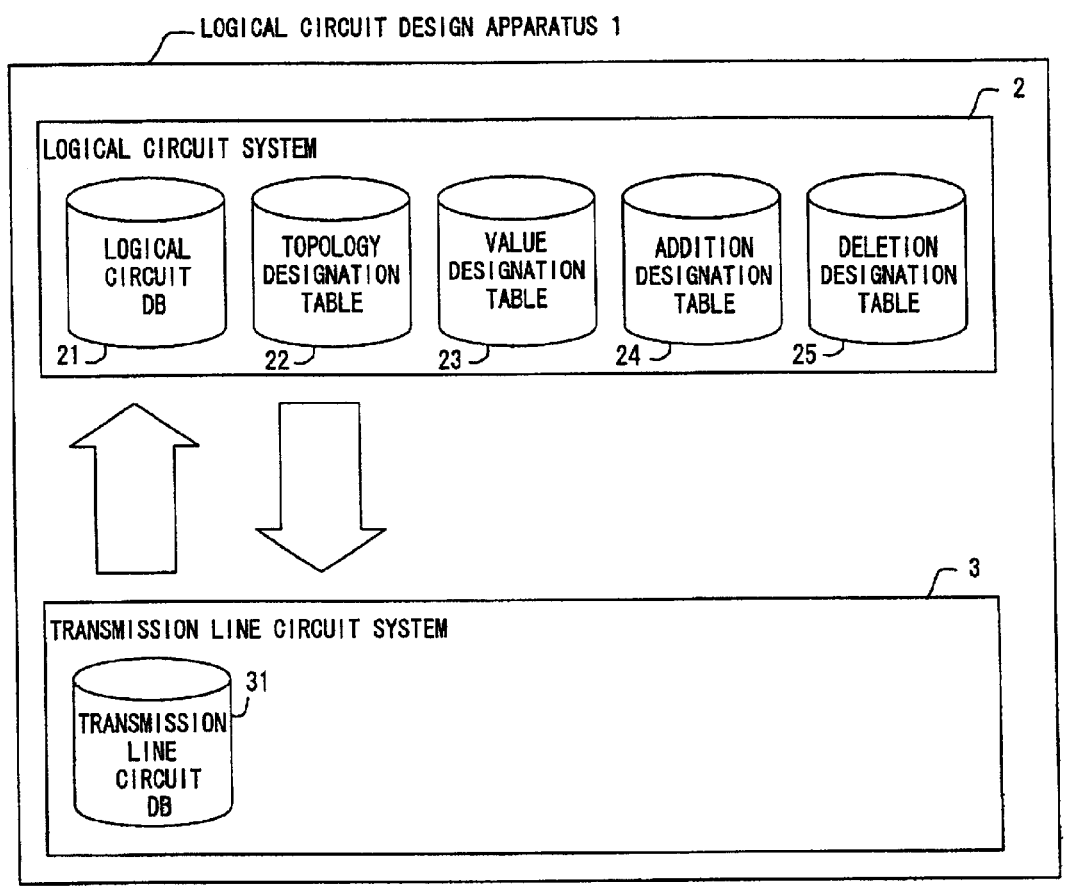
FIG. 2 shows the principle of a logical circuit designing device adopting the present invention.

FIG. 2 shows the principle of a logical circuit designing device adopting the present invention.

The logical circuit designing device 1 comprises a logical circuit system 2 for designing a logical circuit and generating a transmission line circuit based on the logical circuit and a transmission line circuit system 3 for editing a transmission line circuit and feeding back (reflecting) the editing result to (on) the logical circuit, that is, modifying the logical circuit.

The logical circuit system 2 comprises a logical circuit database (DB) 21 for storing a logical circuit, a topology designation table 22 for storing topology information indicating the type of the connection between active components composing a logical circuit, a value designation table 23 for storing the values of passive components composing a circuit, an addition designation table 24 for storing the addition information of passive components composing a logical circuit and a deletion designation table 25 for storing the deletion information of passive components composing a logical circuit.

The logical circuit system 2 extracts a logical circuit from the logical circuit DB 21 and generates a transmission line circuit DB 31.

The logical circuit system 2 also extracts a logical circuit from the logical circuit DB 21 and generates a transmission line circuit DB 31 with the value of a passive component, such as a resistor, a capacitor, a coil and the like, set to the value specified in the value designation table 23.

The logical circuit system 2 also extracts a logical circuit from the logical circuit DB 21 and generates a transmission line circuit DB 31 with a passive component, such as a resistor, a capacitor, a coil and the like, specified in the addition designation table 24 added.

The logical circuit system 2 also extracts a logical circuit from the logical circuit DB 21 and generates a transmission line circuit DB 31 with a passive component, such as a resistor, a capacitor, a coil and the like, specified in the addition designation table 24 deleted.

The transmission line circuit system 3 also comprises a transmission line circuit DB 31 for storing a transmission line circuit corresponding to the logical circuit.

The transmission line circuit system 3 inputs both the logical circuit DB 21 and transmission line circuit DB 31 of the logical circuit system 2, extracts the value modification information of a passive component, such as a resistor, a capacitor, a coil and the like, from the difference between the logical circuit DB 21 and transmission line circuit DB 31 and modifies the logical circuit DB 21 based on this values.

The transmission line circuit system 3 also inputs both the logical circuit DB 21 and transmission line circuit DB 31 of the logical circuit system 2, extracts the modification information of each passive component from this difference and modifies the logical circuit DB 21 based on this modification information.

The transmission line circuit system 3 also inputs both the logical circuit DB 21 and transmission line circuit DB 31 of the logical circuit system 2, extracts the addition information of each passive component from this difference and modifies the logical circuit DB 21 based on this addition information.

The transmission line circuit system 3 also inputs both the logical circuit DB 21 and transmission line circuit DB 31 of the logical circuit system 2, extracts the deletion information of each passive component from this difference and modifies the logical circuit DB 21 based on this deletion information.

Next, the first preferred embodiment of the present invention is described with reference to FIGS. 3 through 27.

Figure 3:
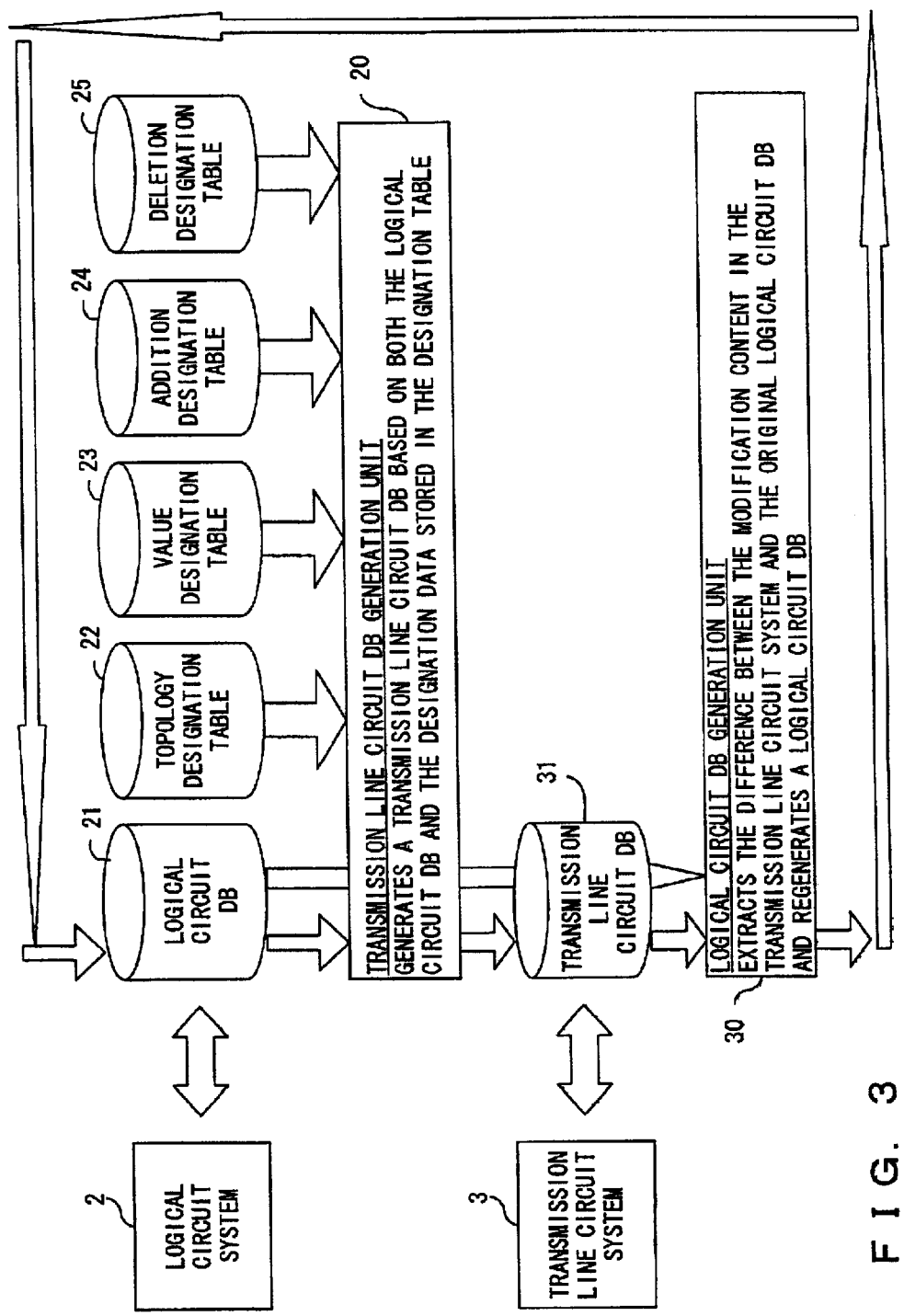
FIG. 3 shows the overall configuration of the first preferred embodiment of the present invention.

FIG. 3 shows the overall configuration of the first preferred embodiment of the present invention.

A transmission line circuit DB generation unit 20 generates a transmission line circuit DB 31 based on both the logical circuit DB 21 and designation data stored in the designation table 56 (at least one of topology designation table 22, value designation table 23, addition designation table 24 and deletion designation table 25).

A logical circuit DB generation unit 30 regenerates (modifies) the logical circuit DB 21 by extracting the difference between a modification (editing) content in the transmission line circuit system 3 and the original logical circuit DB 21.

Figure 4:
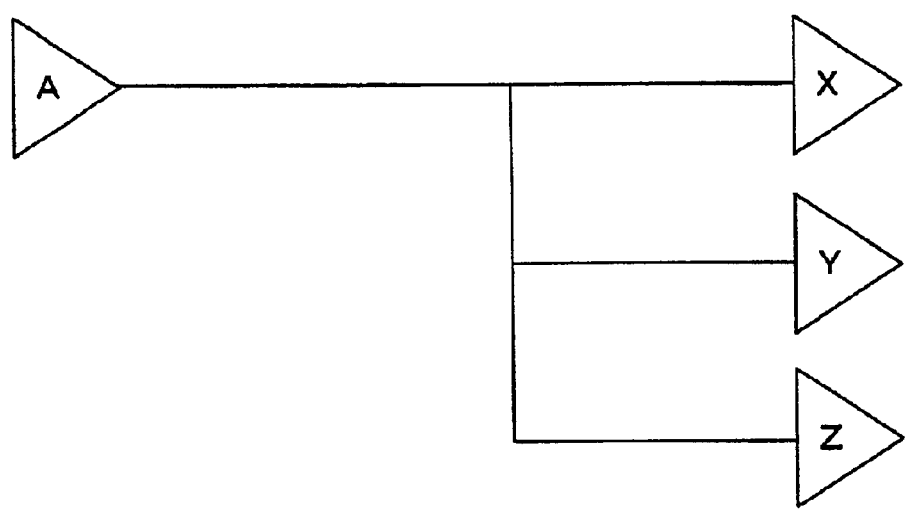
FIG. 4 shows an example of topology designation (general)

FIG. 4 shows an example of topology designation (general).

In FIG. 4, a driver A is connected to receivers X, Y and Z.

FIG. 5 shows an example of topology designation (star type).

In FIG. 5, a driver A is connected to receivers X, Y and Z in a shape of a star. Therefore, the designation of such a connection is called star type.

Figure 6:
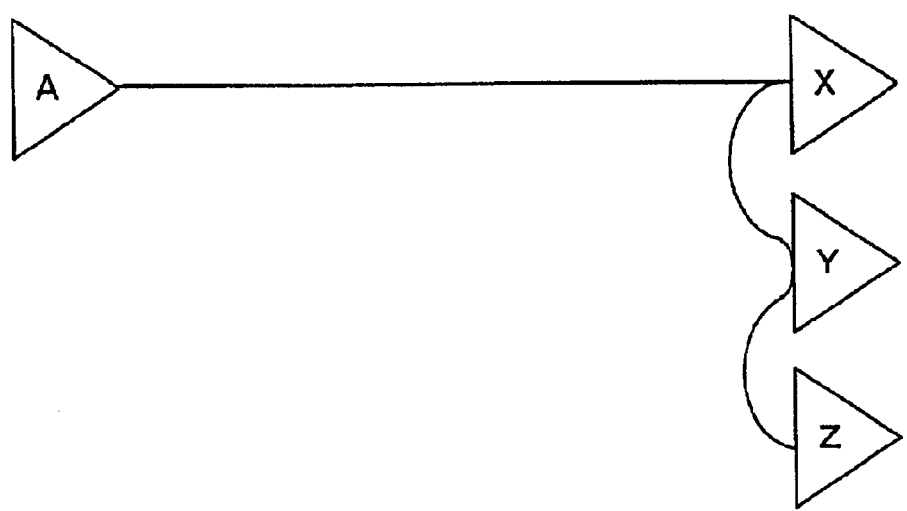
FIG. 6 shows an example of topology designation (single-stroke brushing type)

FIG. 6 shows an example of topology designation (one-stroke brushing type).

In FIG. 6, a driver A is connected to a receiver X, then the receiver X is connected to a receiver Y and the receiver Y is further connected to a receiver Z. Therefore, the designation of such a connection is called one-stroke brushing type.

Next, the value designation of a passive component (resistor, capacitor, coil, etc.) is described with reference to FIGS. 7 through 9.

FIG. 7 shows an example of the value designation of a resistor, a capacitor or a coil (logical circuit).

In FIG. 7, the value of a resistor R1 provided between a driver A and receivers X and Y is 20Ω in a logical circuit.

FIG. 8 shows an example of the value designation of a resistor, a capacitor or a coil (value designation table).

FIG. 8 shows the structure of the value designation table 23 in the case where the value of a resistor R1 is designated as 33Ω.

FIG. 9 shows an example of the value designation of a resistor, a capacitor or a coil (transmission line circuit).

In FIG. 9, the value of a resistor R1 provided between a driver A and receivers X and Y is designated as 33Ω in a transmission line circuit diagram by value designation.

Next, the addition designation of a passive component (resistor, capacitor, coil, etc.) themselves is described with reference to FIGS. 10 through 12.

FIG. 10 shows an example of the addition designation of a resistor, a capacitor or coil (logical circuit).

In FIG. 10, a driver A is connected to receivers X and Y by a NET 1 (a driver A and receivers X and Y constitute a network).

FIG. 11 shows an example of the addition designation of a resistor, a capacitor or a coil (addition designation table).

FIG. 11 shows the structure of the addition designation table 24 in the case where a 33Ω resistor is added by the side of a driver A in a network (NET1) composed of the driver A and receivers X and Y.

Figure 12:
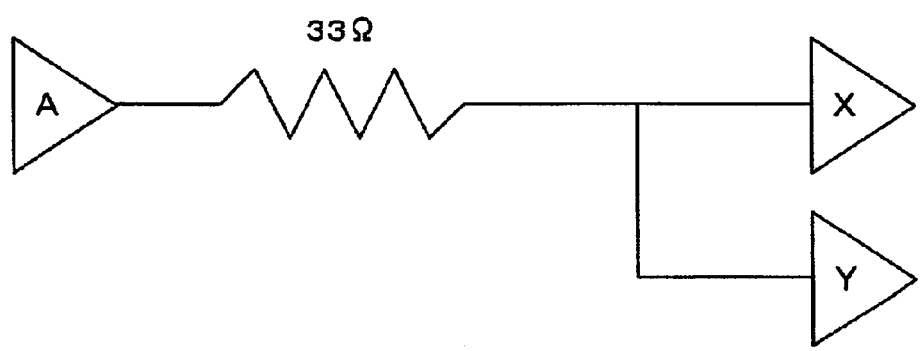
FIG. 12 shows an example of the addition designation of a resistor, a capacitor or a coil (transmission line circuit)

FIG. 12 shows an example of the addition designation of a resistor, a capacitor or a coil (transmission line circuit).

In FIG. 12, a 33Ω resistor is provided by the side of a driver A in a network (NET1) consisting of the driver A and receivers X and Y by passive component (resistor) addition.

Next, the deletion designation of a passive component (resistor, capacitor, coil, etc.) is described with reference to FIGS. 13 through 15.

Figure 13:
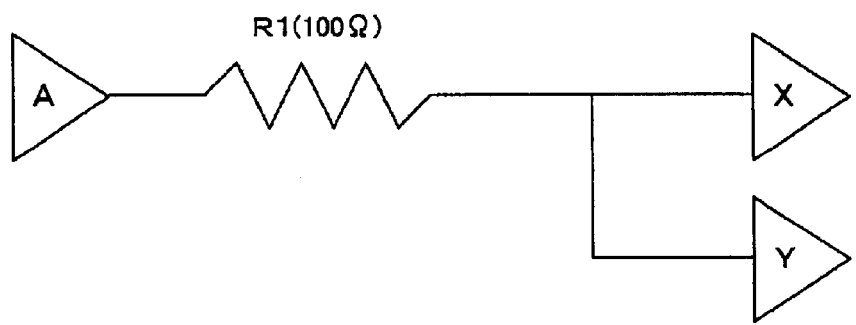
FIG. 13 shows an example of the deletion designation of a resistor, a capacitor or a coil (logical circuit)

FIG. 13 shows an example of the deletion designation of a resistor, capacitor or coil (logical circuit).

In FIG. 13, a 100Ω resistor R1 is provided between a driver A and receivers X and Y in a logical circuit.

Figure 14:
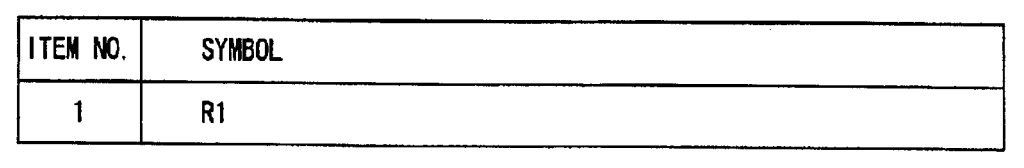

FIG. 14 shows an example of the deletion designation of a resistor, capacitor or coil (addition designation table).

FIG. 14 shows the structure of the deletion designation table 25 in the case where a resistor R1 is deleted.

Figure 15:
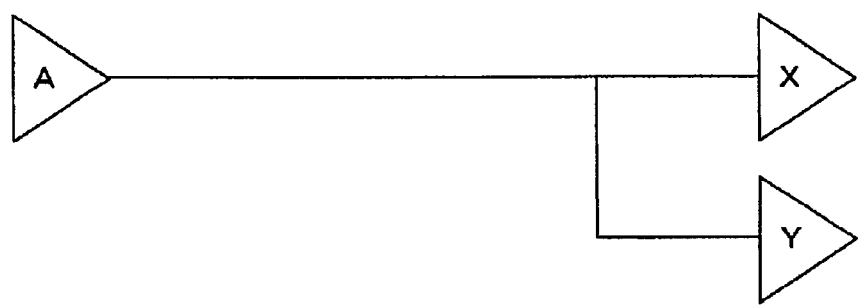
FIG. 15 shows an example of the deletion designation of a resistor, a capacitor or a coil (transmission line circuit)

FIG. 15 shows an example of the deletion designation of a resistor, capacitor or coil (transmission line circuit).

In FIG. 15, a 100Ω resistor R1 provided between a driver A and receivers X and Y, is deleted by passive component (resistor) deletion.

Next, the value modification of a passive component (resistor, capacitor, coil, etc.) is described with reference FIGS. 16 through 18.

FIG. 16 shows an example of the value modification of a resistor, capacitor or coil (logical circuit: original).

In FIG. 16, the value of a resistor R1 provided a driver A and receivers X and Y is 20Ω in a logical circuit.

Figure 17:
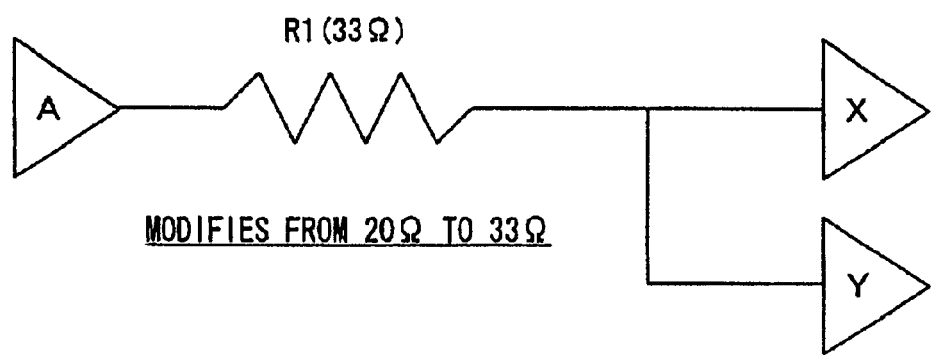
FIG. 17 shows an example of the value modification of a resistor, a capacitor or a coil (transmission line circuit)

FIG. 17 shows an example of the value modification of a resistor, capacitor or coil (transmission line circuit).

In FIG. 17, the value of the resistor R1 is modified from 20Ω to 33Ω in a transmission line circuit.

Figure 18:
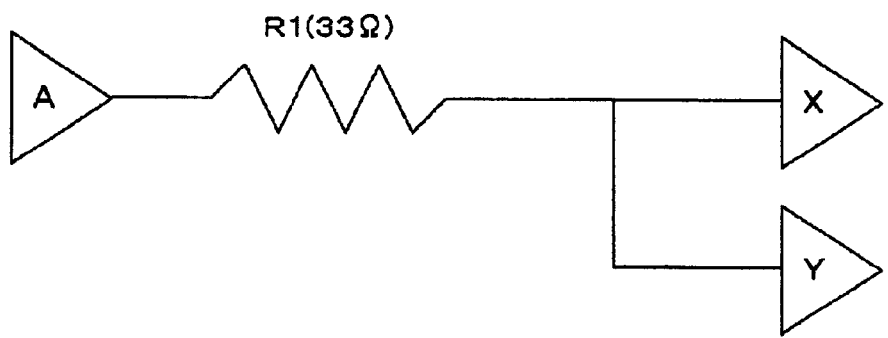
FIG. 18 shows an example of the value modification of a resistor, a capacitor or a coil (logical circuit: after modification)

FIG. 18 shows an example of the value modification of a resistor, capacitor or coil (logical circuit: after modification).

In FIG. 18, the value of the resistor R1 provided between the driver A and receivers X and Y is already modified to 33Ω by value modification.

Next, the component modification of a passive component (resistor, capacitor, coil, etc.) is described with reference to FIGS. 19 through 21.

Figure 19:
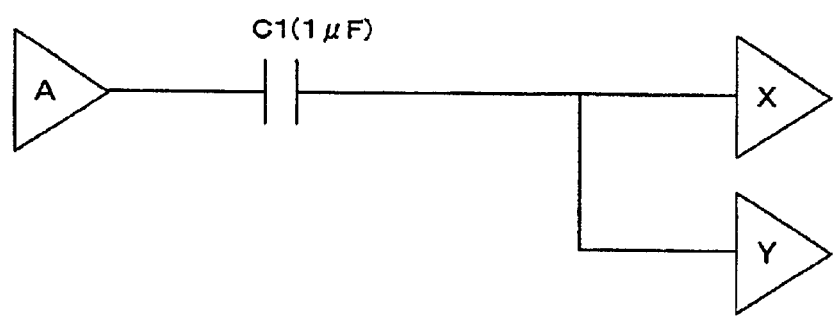
FIG. 19 shows an example of the component modification of a resistor, a capacitor or a coil (logical circuit: original)

FIG. 19 shows an example of the component modification of a resistor, capacitor or coil (logical circuit: original).

In FIG. 19, the value in a logical circuit of a capacitor C1 provided between a driver A and receivers X and Y, is 1 μF.

Figure 20:
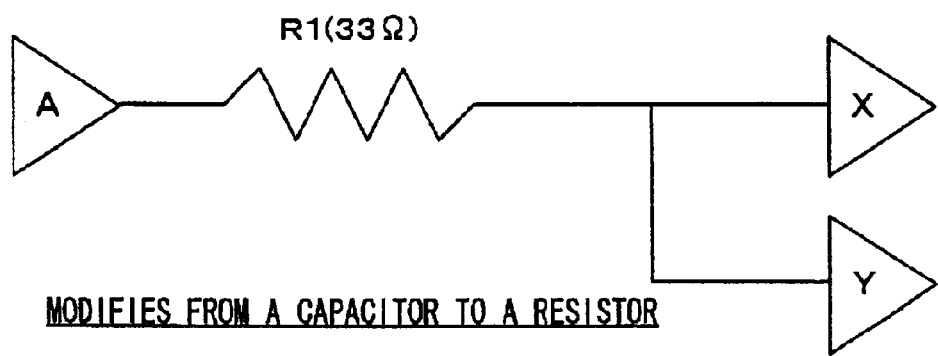
FIG. 20 shows an example of the component modification of a resistor, a capacitor or a coil (transmission line circuit)

FIG. 20 shows an example of the component modification of a resistor, capacitor or coil (transmission line circuit).

In FIG. 20, the capacitor C1 is modified to a 33Ω resistor R1 in a transmission line circuit.

FIG. 21 shows an example of the component modification of a resistor, capacitor or coil (logical circuit: after modification).

In FIG. 21, the 1 μF capacitor C1 provided between the driver A and receivers X and Y, is already modified to the 33Ω resistor R1.

Next, the modification of an active component (driver, receiver, etc.) is described with reference to FIGS. 22 through 24.

FIG. 22 shows an example of component addition (logical circuit).

In FIG. 22, a 33Ω resistor R1 is provided between a driver A and receivers X and Y in a logical circuit.

Figure 23:
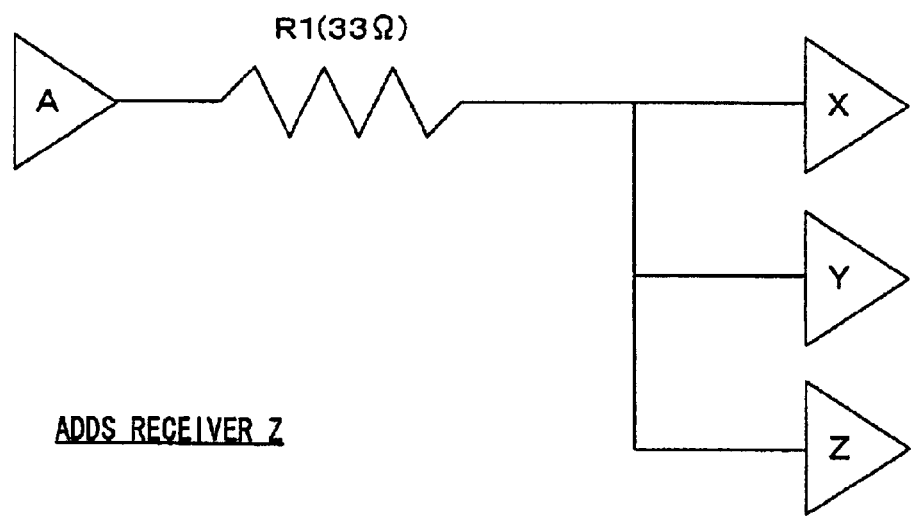
FIG. 23 shows an example of component addition (transmission line circuit)

FIG. 23 shows an example of component addition (transmission line circuit).

In FIG. 23, a receiver Z is added to the receiver X and Y side.

Figure 24:
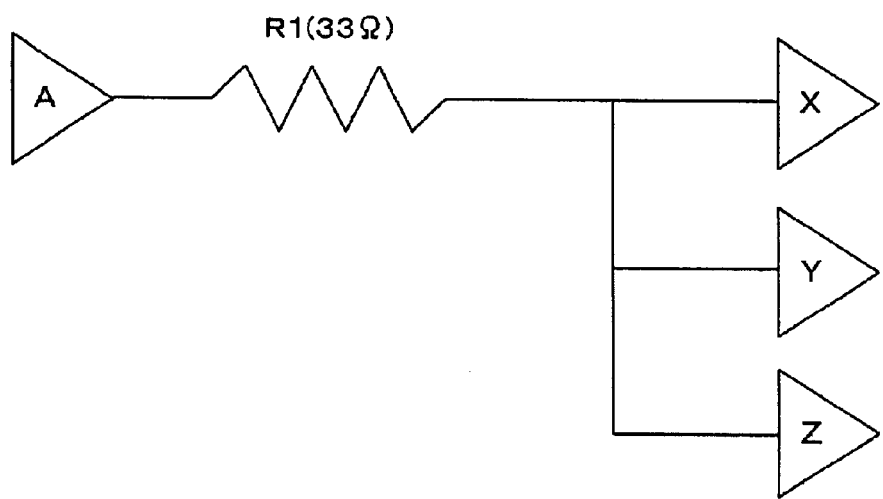
FIG. 24 shows an example of component addition (logical circuit: after modification)

FIG. 24 shows an example of component addition (logical circuit: after modification).

In FIG. 24, the 33Ω resistor R1 is now provided between the driver A and receivers X, Y and Z, that is, the receiver Z is newly added.

Next, the deletion of an active component (driver, receiver, etc.) is described with reference to FIGS. 25 through 27.

FIG. 25 shows an example of component deletion (logical circuit: original).

In FIG. 25, a 33Ω resistor R1 is provided between a driver A and receivers X, Y and Z in a logical circuit.

FIG. 26 shows an example of component deletion (transmission line circuit).

In FIG. 26, the receiver Y on the receiver X, Y and Z side is deleted.

Figure 27:
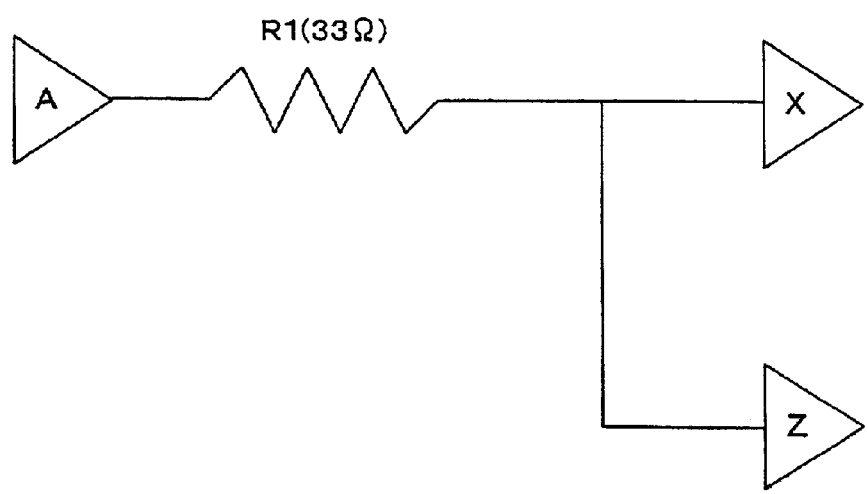
FIG. 27 shows an example of component deletion (logical circuit: after modification)

FIG. 27 shows an example of component deletion (logical circuit: after modification).

In FIG. 27, the 33Ω resistor R1 is now provided between the driver A and receivers X and Z, that is, the receiver Y is now deleted.

Next, the second preferred embodiment of the present invention is described.

Figure 28:
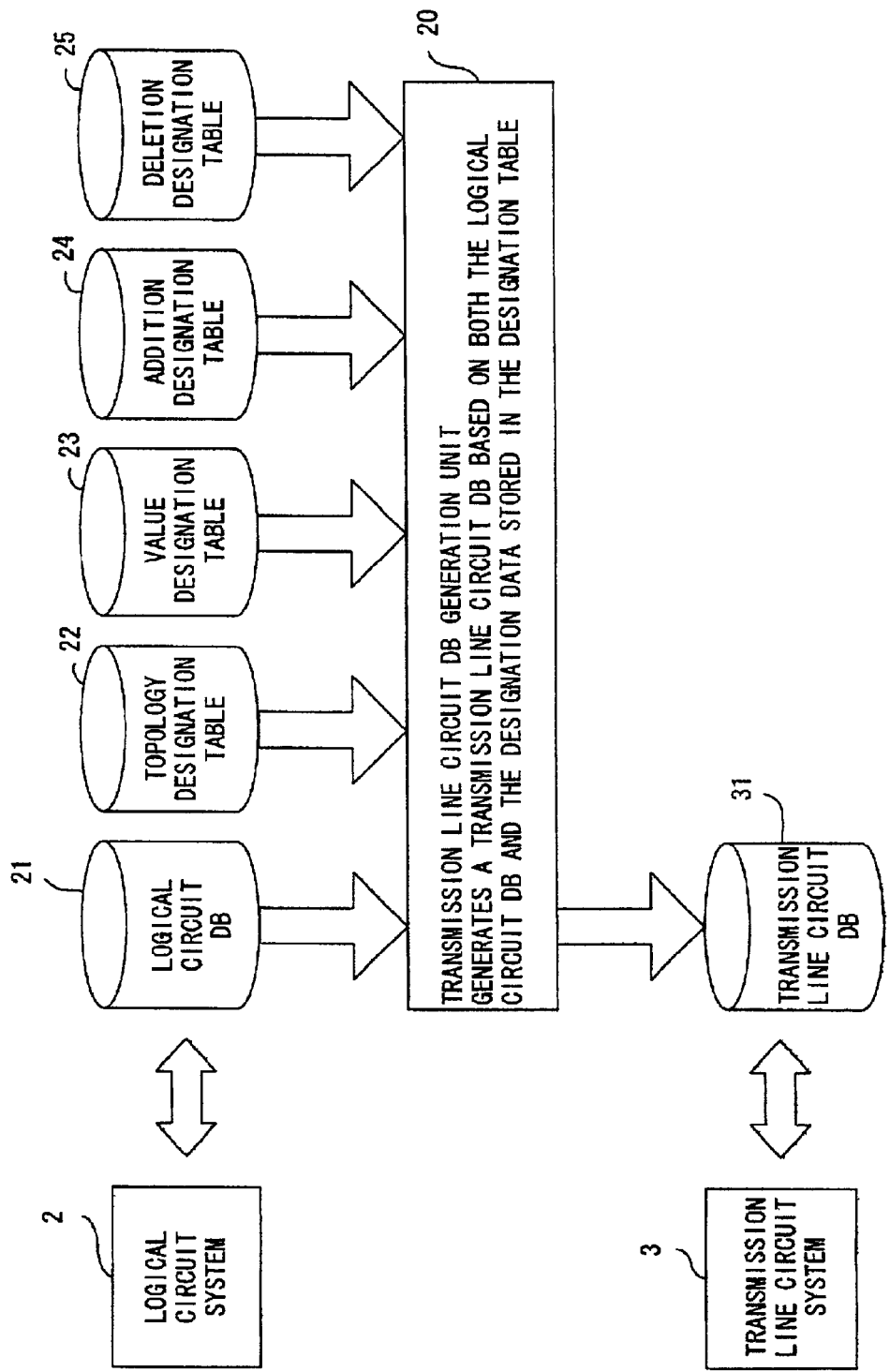
FIG. 28 shows the overall configuration of the second preferred embodiment of the present invention.

FIG. 28 shows the overall configuration of the second preferred embodiment of the present invention.

The transmission line circuit DB generation unit 20 generates a transmission line circuit DB 31 based on both the logical circuit DB 21 and designation data stored in the designation table 56 (at least one of topology designation table 22, value designation table 23, addition designation table 24 and deletion designation table 25).

Next, the third preferred embodiment of the present invention is described.

Figure 29:
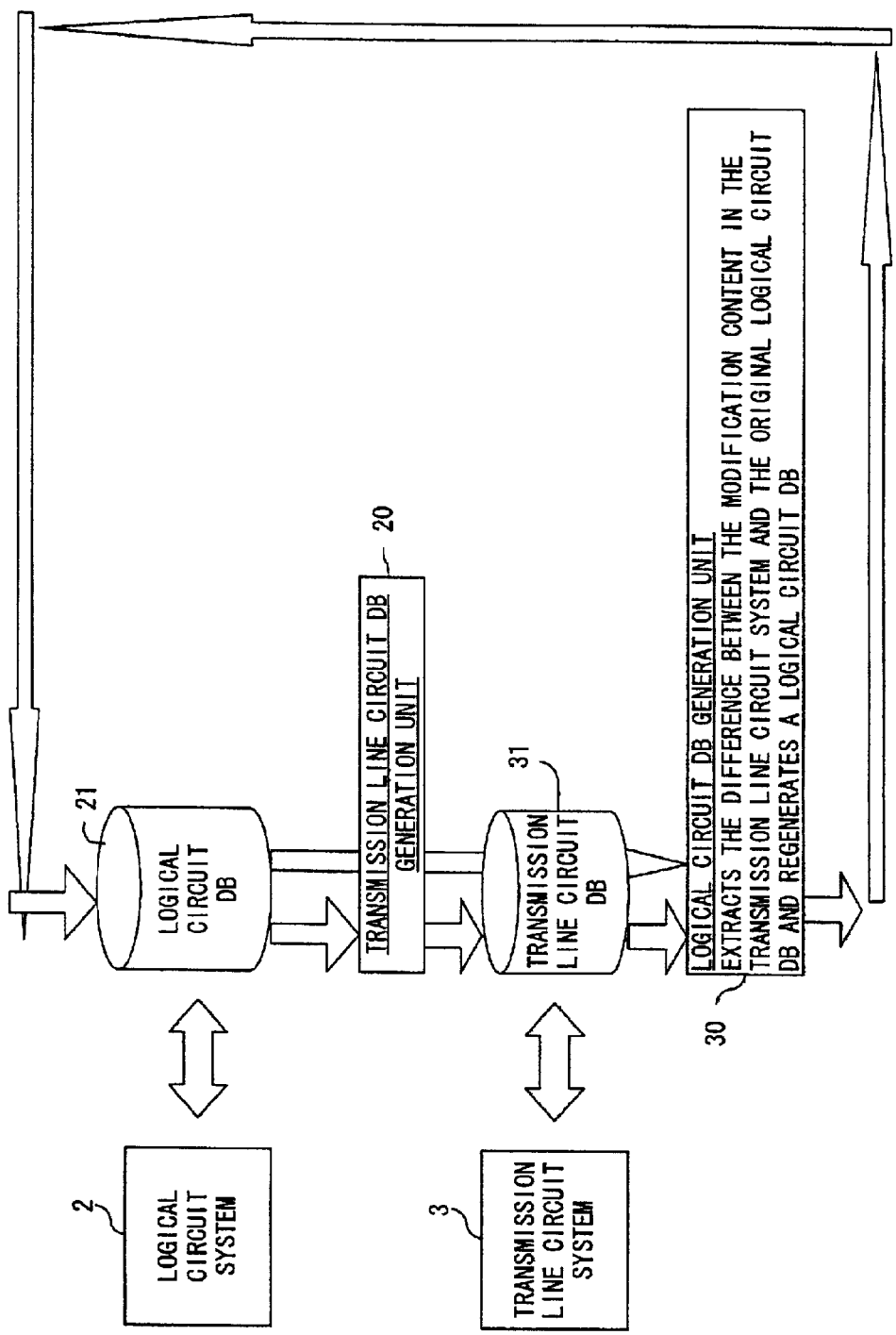
FIG. 29 shows the overall configuration of the third preferred embodiment of the present invention.

FIG. 29 shows the overall configuration of the third preferred embodiment of the present invention.

The logical circuit DB generation unit 30 regenerates (modifies) the logical circuit DB 21 by extracting the difference between a modification (editing) content in the transmission line circuit system 3 and the original logical circuit DB 21.

Although the preferred embodiments of the present invention have been described above with reference to the drawings, the logical circuit CAD apparatus adopting the present invention is not limited to the preferred embodiments described above only if the function can be executed. The apparatus can be a single apparatus, a system consisting of a plurality of apparatuses or integrated apparatus, or a system for performing the process through a network, such as a LAN, WAN and the like.

Figure 30:
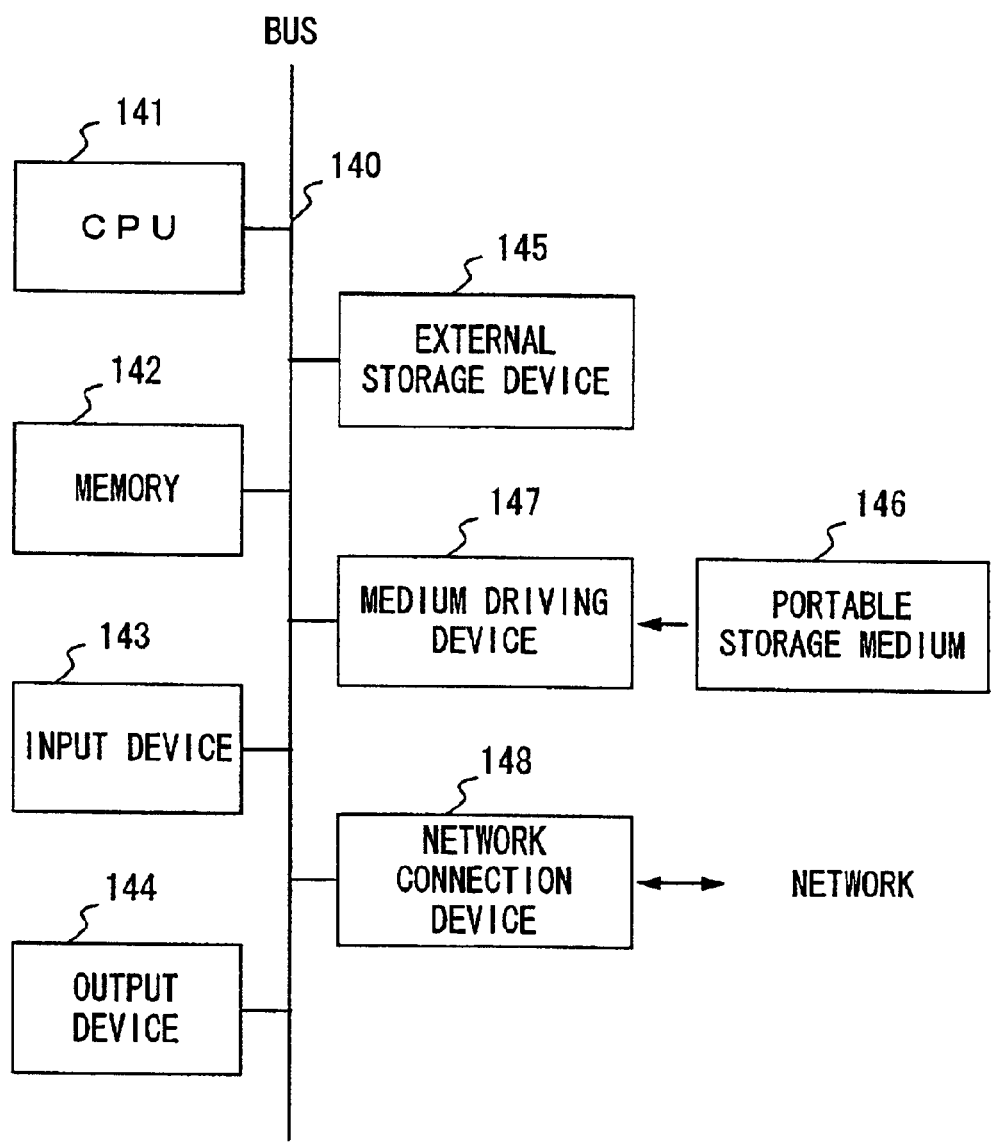
FIG. 30 shows the configuration of the logical circuit designing device.

As shown in FIG. 30, the logical circuit CAD apparatus can also be implemented by a system comprising a CPU 141, a memory 142, such as a ROM and a RAM, an input device 143, an output device 144, an external storage device 145, a medium driving device 147, a portable storage medium 146, a network connection device 148, which are all connected to a bus 140. Specifically, the function of the preferred embodiment described above can also be implemented by providing the logical circuit CAD apparatus with the memory 142, such as a ROM and a RAM, external storage device 145 or portable storage medium 146 which store the program codes software program codes for implementing the system in the preferred embodiment described above and by enabling the computer of the logical circuit CAD apparatus to read and execute the program codes.

In this case, the program codes read from the portable storage medium 146 and the like enable the computer to implement the new function of the present invention, and the portable storage medium 146 and the like which stores the program codes constitutes the present invention.

For the portable storage media for providing the program codes, for example, a flexible disk, a hard disk, an optical disk, a magneto-optical disk, a CD-ROM, a CD-R, a DVD-ROM, a DVD-RAM, a magnetic tape, a non-volatile memory card, a ROM card, a variety of storage media that store the program codes through the network connection device (in other words, communications line), such as an electronic mail, personal communications, etc., and the like can be used.

Figure 31:
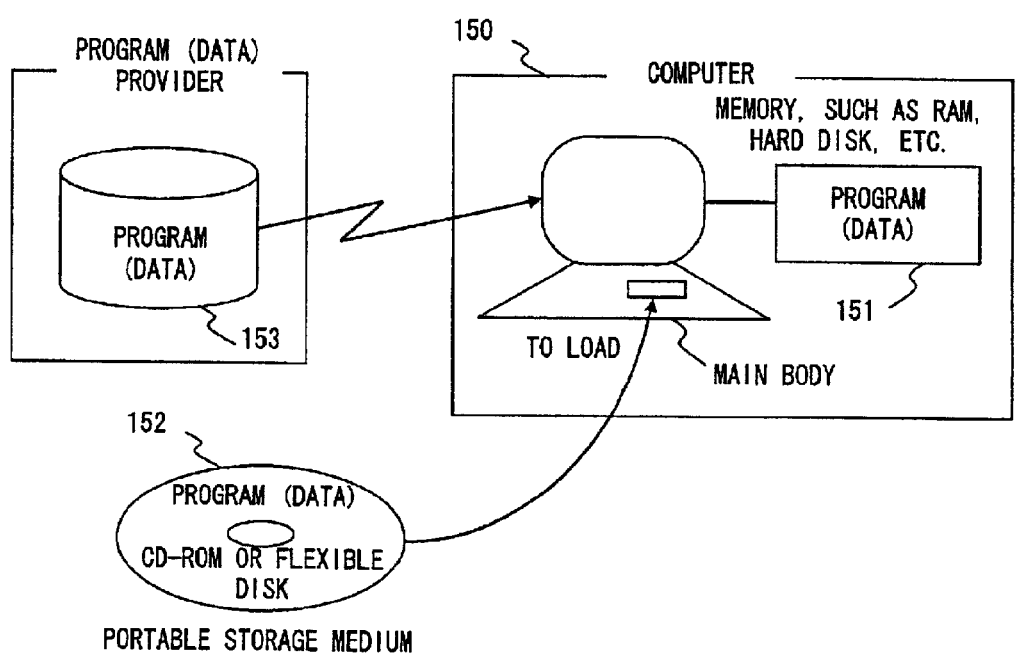
FIG. 31 shows the loading into a computer of a program in the present invention.

Although the function of the preferred embodiment described above can be implemented by enabling a computer 150 to execute the program codes read in a memory 151, as shown in FIG. 31, the function can also be implemented by enabling an OS that is operated in the computer and the like to perform a part or all of the actual process according to the instructions of the program codes.

Furthermore, the function of the preferred embodiment described above can also be implemented by writing the program codes read from the portable storage medium 152 and program/data 153 provided by a program/data provider in the memory 151 which is provided in a function extension board inserted in the computer 150 or provided in a function extension unit connected to the computer 150 and then enabling a CPU and the like which is provided in the function extension board or unit to perform a part or all of the actual process.

In other words, the present invention is not limited to the preferred embodiments described above and can take a variety of configurations or structures within the scope of the objective of the present invention.

As described above, according to the present invention, work that has manually been done can be automated. Therefore, labor can be reduced and data reliability can be improved.

What is claimed is:

1. A logical circuit designing device, comprising:
   a logical circuit storage unit storing a logical circuit;
   a transmission line circuit storage unit storing a transmission line circuit corresponding to the logical circuit stored in the logical circuit storage unit;
   a transmission line circuit editing unit editing the transmission line circuit stored in the transmission line circuit storage unit; and
   a logical circuit modification unit modifying the corresponding logical circuit according to a difference between the transmission line circuit edited by the transmission line circuit editing unit and the logical circuit, and
   wherein the logic circuit is automatically modified when the transmission line circuit is re-edited.

2. A logical circuit designing device, comprising:
   a logical circuit storage unit storing a logical circuit;
   a transmission line circuit generation unit generating a transmission line circuit based on the logical circuit stored in the logical circuit storage unit;
   a transmission line circuit storage unit storing the transmission line circuit generated by the transmission line circuit generation unit;
   a transmission line circuit editing unit editing the transmission line circuit stored in the transmission line circuit storage unit; and
   a logical circuit modification unit modifying the corresponding logical circuit according to a differential between the transmission line circuit edited by the transmission line circuit editing unit and the logical circuit, and wherein the logic circuit is automatically modified when the transmission line circuit is re-edited.

3. The logical circuit designing device according to claim 2, further comprising
a topology designation table storing topology information indicating a type of a connection between active components composing a logical circuit, and
wherein said transmission line circuit generation unit generates a transmission line circuit based on the topology information stored in the topology designation table.

4. The logical circuit designing device according to claim 2, further comprising
a value designation table storing a value of a passive component composing a logical circuit, and wherein said transmission line circuit generation unit generates a transmission line circuit based on the value stored in the value designation table.

5. The logical circuit designing device according to claim 2, further comprising
an addition designation table storing addition information of a passive component composing a logical circuit, and wherein said transmission line circuit generation unit generates a transmission line circuit by adding the passive component based on the passive component addition information stored in the addition designation table.

6. The logical circuit designing device according to claim 4, wherein said logical circuit modification unit modifies the value of a passive component of the logical circuit stored in the logical circuit storage unit based on the transmission line circuit edited by the transmission line circuit editing unit.

7. The logical circuit designing device according to claim 5, wherein said logical circuit modification unit modifies the passive component addition information of the logical circuit stored in the logical circuit storage unit based on the transmission line circuit edited by the transmission line circuit editing unit.

8. A logical circuit designing device comprising:
a logical circuit storage unit storing a logical circuit;
a topology designation table storing topology information indicating types of connections between active components composing the logical circuit; and
a transmission line circuit generation unit generating transmission line circuit data suitable for transmission line circuit analysis based on the stored logical circuit and the logical circuit connection topology information stored in the topology designation table; and
a transmission line circuit data storage unit storing the transmission line circuit data generated by the transmission line circuit generation unit.

9. A logical circuit designing device comprising:
a logical circuit storage unit storing a logical circuit;
a value designation table storing values of passive components composing the logical circuit; and
a transmission line circuit generation unit generating transmission line circuit data suitable for transmission line circuit analysis based on the stored logical circuit and the values of the logical circuit passive components stored in the value designation table; and
a transmission line circuit data storage unit storing the transmission line circuit data generated by the transmission line circuit generation unit.

10. A logical circuit designing device comprising:
a logical circuit storage unit storing a logical circuit;
an addition designation table storing addition information of passive components composing the logical circuit; and
a transmission line circuit generation unit generating transmission line circuit data suitable for transmission line circuit analysis based on the stored logical circuit and by adding the passive components according to the passive component addition information stored in the addition designation table.

11. A logical circuit designing device, comprising:
a logical circuit storage unit storing a logical circuit;
a transmission line circuit generation unit generating a transmission line circuit based on the logical circuit stored in the logical circuit storage unit;
a transmission line circuit storage unit storing the transmission line circuit generated by the transmission line circuit generation unit; and
a deletion designation table storing deletion information of a passive component composing a logical circuit, and
wherein said transmission line circuit generation unit generates a transmission line circuit by deleting the passive component based on the passive component deletion information stored in the deletion designation table.

12. A logical circuit designing device, comprising:
a logical circuit storage unit storing a logical circuit;
a transmission line circuit generation unit generating a transmission line circuit based on the logical circuit stored in the logical circuit storage unit;
a transmission line circuit storage unit storing the transmission line circuit generated by the transmission line circuit generation unit;
a transmission line circuit editing unit editing the transmission line circuit stored in the transmission line circuit storage unit;
a logical circuit modification unit modifying the corresponding logical circuit based on the transmission line circuit edited by the transmission line circuit editing unit; and
a deletion designation table storing deletion information of a passive component composing a logical circuit, and wherein said transmission line circuit generation unit generates a transmission line circuit by deleting the passive component based on the passive component deletion information stored in the deletion designation table.

13. The logical circuit designing device according to claim 12, wherein said logical circuit modification unit modifies the passive component deletion information of the logical circuit stored in the logical circuit storage unit based on the transmission line circuit edited by the transmission line circuit editing unit.

14. A logical circuit designing method, comprising:
editing a transmission line circuit stored in a transmission line circuit database; and
modifying a logical circuit corresponding to the transmission line circuit according to a difference between the edited transmission line circuit and the logical circuit, and
wherein the logic circuit is automatically modified when the transmission line circuit is re-edited.

15. A logical circuit designing method, comprising:
generating a transmission line circuit based on a logical circuit stored in a logical circuit database;

storing the generated transmission line circuit in a transmission line circuit database;

editing the transmission line circuit stored in the transmission line circuit database; and modifying the logical circuit according to a difference between the edited transmission line circuit and the logical circuit, and wherein the logic circuit is automatically modified when the transmission line circuit is re-edited.

16. The logical circuit designing method according to claim 15, wherein the transmission line circuit is generated based on topology information stored in a topology designation table storing topology information indicating a type of a connection between active components composing a logical circuit, in said generating.

17. The logical circuit designing method according to claim 15, wherein the transmission line circuit is generated based on a value stored in a value designation table storing values of passive components composing a logical circuit, in said generating.

18. The logical circuit designing method according to claim 15, wherein the transmission line circuit is generated by adding a passive component based on addition information of the passive component stored in an addition designation table storing addition information of passive components composing a logical circuit, in said generating.

19. The logical circuit designing method according to claim 17, wherein the logical circuit is modified by modifying a value of a logical circuit stored in said logical circuit database based on the transmission line circuit edited by said editing, in said modifying.

20. The logical circuit designing method according to claim 18, wherein the logical circuit is modified by modifying passive component addition information of a logical circuit stored in the logical circuit database based on the transmission line circuit edited by said editing, in said modifying.

21. A logical circuit designing method, comprising:

generating transmission line circuit data suitable for transmission line circuit analysis based on a logical circuit stored in a logical circuit database and the logical circuit connection topology information stored in a topology designation table indicating types of connections between active components composing the logical circuit; and storing the generated transmission line circuit data in a transmission line circuit database.

22. A logical circuit designing method, comprising:

generating transmission line circuit data suitable for transmission line circuit analysis based on a logical circuit stored in a logical circuit database and values of passive components stored in a value designation table for the passive components composing the logical circuit; and storing the generated transmission line circuit data in a transmission line circuit database.

23. A logical circuit designing method, comprising:

generating transmission line circuit data suitable for transmission line circuit analysis based on a logical circuit stored in a logical circuit database and by adding passive components based on passive component addition information stored in an addition designation table storing the addition information of the passive components composing the logical circuit; and storing the generated transmission line circuit data in a transmission line circuit database.

24. A logical circuit designing method, comprising:

generating a transmission line circuit based on a logical circuit stored in a logical circuit database; and storing the generated transmission line circuit in a transmission line circuit database, and wherein the transmission line circuit is generated by deleting a passive component based on passive component deletion information stored in a deletion designation table storing deletion information of passive components composing a logical circuit, in said generating.

25. A logical circuit designing method, comprising:

generating a transmission line circuit based on a logical circuit stored in a logical circuit database;

storing the generated transmission line circuit in a transmission line circuit database editing the transmission line circuit stored in the transmission line circuit database; and modifying the generated logical circuit based on the edited transmission line circuit, and wherein the transmission line circuit is generated by deleting a passive component based on deletion information of the passive component stored in a deletion designation table storing deletion information of passive components composing a logical circuit, in said generating.

26. The logical circuit designing method according to claim 25, wherein the logical circuit is modified by modifying passive component deletion information of a logical circuit stored in the logical circuit database based on the transmission line circuit edited by said editing, in said modifying.

27. A computer-readable storage medium which stores a logical circuit designing program for enabling a computer, comprising:

editing the transmission line circuit stored in the transmission line circuit database; and modifying a logical circuit corresponding to the transmission line circuit according to a difference between the edited transmission line circuit and the logical circuit, and wherein the logic circuit is automatically modified when the transmission line circuit is re-edited.

28. A computer-readable storage medium which stores a logical circuit designing program for enabling a computer, comprising:

generating a transmission line circuit based on a logical circuit stored in a logical circuit database;

storing the generated transmission line circuit in a transmission line circuit database;

editing the transmission line circuit stored in the transmission line circuit database; and modifying the logical circuit corresponding to the transmission line circuit according to a difference between the edited transmission line circuit and the logical circuit, and wherein the logic circuit is automatically modified when the transmission line circuit is re-edited.

29. The storage medium according to claim 28, wherein the transmission line circuit is generated based on topology information stored in a topology designation table storing types of connections between active components composing a logical circuit, in said generating.

30. The storage medium according to claim 28, wherein the transmission line circuit is generated based on a value stored in a value designation table storing values of passive components composing a logical circuit, in said generating.

31. The storage medium according to claim 28, wherein the transmission line circuit is generated by adding a passive component based on passive component addition information stored in an addition designation table storing addition information pf passive components composing a logical circuit, in said generating.

32. The storage medium according to claim 30, wherein the logical circuit is modified by modifying a value of a logical circuit stored in said logical circuit database based on the transmission line circuit edited by said editing, in said modifying.

33. The storage medium according to claim 31, wherein the logical circuit is modified by modifying passive component addition information of a logical circuit stored in the logical circuit database based on the transmission line circuit edited by said editing, in said modifying.

34. A machine readable storage storing at least one program controlling a computer according to a process comprising:
    generating transmission line circuit data suitable for transmission line circuit analysis based on a logical circuit stored in a logical circuit database and the logical circuit connection topology information stored in a topology designation table indicating types of connections between active components composing the logical circuit; and
    storing the generated transmission line circuit data in a transmission line circuit database.

35. A machine readable storage storing at least one program controlling a computer according to a process comprising:
    generating transmission line circuit data suitable for transmission line circuit analysis based on a logical circuit stored in a logical circuit database and values of passive components stored in a value designation table storing the values of the passive components composing the logical circuit; and
    storing the generated transmission line circuit data in a transmission line circuit database.

36. A machine readable storage storing at least one program controlling a computer according to a process comprising:
    generating transmission line circuit data suitable for transmission line circuit analysis based on a logical circuit stored in a logical circuit database and by adding passive components based on passive component addition information stored in an addition designation table storing the addition information of the passive components composing the logical circuit; and
    storing the generated transmission line circuit data in a transmission line circuit database.

37. A computer-readable storage medium which stores a logical circuit designing program for enabling a computer, comprising:
    generating a transmission line circuit based on a logical circuit stored in a logical circuit database; and
    storing the generated transmission line circuit in a transmission line circuit database, and
    wherein the transmission line circuit is generated by deleting a passive component based on passive component addition information stored in an addition designation table storing deletion information of passive components composing a logical circuit, in said generating.

38. A computer-readable storage medium which stores a logical circuit designing program for enabling a computer, comprising:
    generating a transmission line circuit based on a logical circuit stored in a logical circuit database;
    storing the generated transmission line circuit in a transmission line circuit database;
    editing the transmission line circuit stored in the transmission line circuit database; and
    modifying a logical circuit corresponding to the transmission line circuit based on the edited transmission line circuit, and
    wherein the transmission line circuit is generated by deleting a passive component based on passive component deletion information stored in a deletion designation table storing the deletion information of the passive components composing the logical circuit, in said generating.

39. The storage medium according to claim 38, wherein the logical circuit is modified by modifying passive component deletion information of a logical circuit stored in the logical circuit database based on the transmission line circuit edited by said editing, in said modifying.

40. A logical circuit designing device, comprising:
    editing means for editing the transmission line circuit stored in the transmission line circuit database; and
    modifying means for modifying a logical circuit corresponding to the transmission line circuit according to a difference between the edited transmission line circuit and the logical circuit, and
    wherein the modifying means automatically modifies the logical circuit when the transmission line circuit is re-edited.

41. A logical circuit designing device, comprising:
    transmission line circuit generation means for generating a transmission line circuit based on a logical circuit stored in a logical circuit database;
    storage means for storing the generated transmission line circuit in a transmission line circuit database;
    editing means for editing the transmission line circuit stored in the transmission line circuit database; and
    modifying means for modifying the logical circuit corresponding to the transmission line circuit based on the edited transmission line circuit,
    wherein the modifying means automatically modifies the logical circuit when the transmission line circuit is re-edited.

42. The logical circuit designing device according to claim 41, wherein the transmission line circuit generation means generates the transmission line circuit based on topology information stored in a topology designation table storing types of connections between active components composing a logical circuit.

43. The logical circuit designing device according to claim 41, wherein the transmission line circuit generation means generates the transmission line circuit based on a value stored in a value designation table storing values of passive components composing a logical circuit.

44. The logical circuit designing device according to claim 41, wherein the transmission line circuit generation means generates the transmission line circuit by adding a passive component based on passive component addition information stored in an addition designation table storing addition information of passive components composing a logical circuit.

45. The logical circuit designing device according to claim 43, wherein the modifying means modifies the logical circuit by modifying a value of a logical circuit stored in the logical circuit database based on the transmission line circuit edited by said editing.

46. The logical circuit designing device according to claim 44, wherein the modifying means modifies the logical circuit by modifying passive component addition information of a logical circuit stored in the logical circuit database based on the transmission line circuit edited by said editing.

47. A logical circuit designing device, comprising:

transmission line circuit generation means generating transmission line circuit data suitable for transmission line circuit analysis based on a logical circuit stored in a logical circuit database and the logical circuit connection topology information stored in a topology designation table that stores topology information indicating types of connections between active components composing the logical circuit; and storage means for storing the generated transmission line circuit data in a transmission line circuit database.

48. A logical circuit designing device, comprising:

transmission line circuit generation means generating transmission line circuit data suitable for transmission line circuit analysis based on a logical circuit stored in a logical circuit database and passive component values stored in a value designation table storing the values of the passive components composing the logical circuit; and storage means for storing the generated transmission line circuit data in a transmission line circuit database.

49. A logical circuit designing device, comprising:

transmission line circuit generation means generating transmission line circuit data suitable for transmission line circuit analysis based on a logical circuit stored in a logical circuit database and by adding passive components based on passive component addition information stored in an addition designation table storing the addition information of the passive components composing the logical circuit; and storage means for storing the generated transmission line circuit data in a transmission line circuit database.

50. A logical circuit designing device, comprising:

transmission line circuit generation means for generating a transmission line circuit based on a logical circuit stored in a logical circuit database; and storage means for storing the generated transmission line circuit in a transmission line circuit database, and wherein the transmission line circuit is generated by deleting a passive component based on passive component addition information stored in an addition designation table storing deletion information of passive components composing a logical circuit.

51. A logical circuit designing device, comprising:

transmission line circuit generation means for generating a transmission line circuit based on a logical circuit stored in a logical circuit database;

storage means for storing the generated transmission line circuit in a transmission line circuit database;

editing means for editing the transmission line circuit stored in the transmission line circuit database; and modifying means for modifying a logical circuit corresponding to the transmission line circuit based on the edited transmission line circuit, and wherein the transmission line circuit is generated by deleting a passive component based on passive component addition information stored in an addition designation table storing deletion information of passive components composing a logical circuit, in said generating.

52. The logical circuit designing device according to claim 51, wherein the modifying means modifies the logical circuit by modifying passive component deletion information of a logical circuit stored in the logical circuit database based on the transmission line circuit edited by said editing.

53. A logical circuit designing device, comprising:

logical circuit storage means for storing a logical circuit;

storage means for storing at least one of logical circuit topology information, values of passive components, addition and/or deletion information of the passive components;

transmission line circuit generation means for generating transmission line circuit data suitable for transmission line circuit analysis based on the logical circuit stored in the logical circuit storage means and the stored at least one of logical circuit topology information, values of passive components, addition and/or deletion information of the passive components; and transmission line circuit storage means for storing the transmission line circuit data generated by the transmission line circuit generation means.

* * * * *

UNITED STATES PATENT AND TRADEMARK OFFICE
CERTIFICATE OF CORRECTION

PATENT NO.    : 6,757,880 B2
DATED         : June 29, 2004
INVENTOR(S)   : Makoto Kakegawa It is certified that error appears in the above-identified patent and that said Letters Patent is hereby corrected as shown below:

Column 15,
Line 7, change "pf" to -- of --.

Signed and Sealed this

Fifteenth Day of February, 2005

JON W. DUDAS
*Director of the United States Patent and Trademark Office*